United States Patent
Liu et al.

(10) Patent No.: US 11,348,896 B2
(45) Date of Patent: May 31, 2022

(54) METHOD FOR PRODUCING A SEMICONDUCTOR MODULE BY USING ADHESIVE ATTACHMENT PRIOR TO SINTERING

(71) Applicants: AUDI AG, Ingolstadt (DE); Hitachi Energy Switzerland AG, Baden (CH)

(72) Inventors: Chunlei Liu, Oberrohrdorf (CH); Fabian Mohn, Ennetbaden (CH); Jürgen Schuderer, Zürich (CH)

(73) Assignees: AUDI AG, Ingolstadt (DE); Hitachi Energy Switzerland AG, Baden (CH)

( * ) Notice: Subject to any disclaimer, the term of this patent is extended or adjusted under 35 U.S.C. 154(b) by 7 days.

(21) Appl. No.: 16/844,341

(22) Filed: Apr. 9, 2020

(65) Prior Publication Data

US 2020/0350276 A1  Nov. 5, 2020

(30) Foreign Application Priority Data

May 2, 2019  (DE) ................... 10 2019 206 260.1

(51) Int. Cl.
*H01L 23/00* (2006.01)
*B60R 16/033* (2006.01)
*H02M 7/00* (2006.01)

(52) U.S. Cl.
CPC ............ *H01L 24/83* (2013.01); *B60R 16/033* (2013.01); *H01L 24/30* (2013.01); *H02M 7/003* (2013.01); *H01L 2224/8384* (2013.01)

(58) Field of Classification Search
CPC ....................................................... H01L 24/83
USPC ......................................................... 257/783
See application file for complete search history.

(56) References Cited

U.S. PATENT DOCUMENTS

| 6,274,407 | B1 | 8/2001 | Baker et al. |
| 2002/0046873 | A1* | 4/2002 | Chung ................ H01L 23/5387 174/137 R |
| 2009/0016088 | A1* | 1/2009 | Bayerer .................. H01L 24/16 363/125 |
| 2015/0115478 | A1 | 4/2015 | Otsuki et al. |

FOREIGN PATENT DOCUMENTS

| CN | 103894697 A | 7/2014 |
| DE | 10 2004 055 511 B3 | 2/2006 |
| DE | 10 2014 105 957 B3 | 6/2015 |

(Continued)

OTHER PUBLICATIONS

Examination Report dated Nov. 22, 2019 in corresponding German application No. 10 2019 206 260.1; 14 pages including Machine-generated English-language translation.

(Continued)

*Primary Examiner* — Ajay Arora
(74) *Attorney, Agent, or Firm* — Maier & Maier, PLLC

(57) ABSTRACT

A method for producing a semiconductor module, involving the steps: providing a carrier plate and a substrate having a bonding layer arranged on a surface of the carrier plate or the substrate, applying adhesive in multiple adhesive areas of the carrier plate or the substrate which are free from the bonding layer, positioning the substrate on the carrier plate such that the substrate and the carrier plate are in contact with the bonding layer and the adhesive, and joining the substrate and the carrier plate across the bonding layer by melting or sintering of the bonding layer.

11 Claims, 2 Drawing Sheets

(56) References Cited

FOREIGN PATENT DOCUMENTS

| | | | |
|---|---|---|---|
| DE | 10 2015 107 724 A1 | 10/2016 | |
| DE | 102015107724 A1 * | 10/2016 | ....... H01L 23/49513 |
| EP | 0 712 153 A2 | 5/1996 | |
| JP | 2003-297988 A | 10/2003 | |
| JP | 2005026628 A | 1/2005 | |

OTHER PUBLICATIONS

Search Report dated Mar. 11, 2021 in corresponding European Application No. 20168144.2; 15 pages including partial machine generated English-language translation.

European Search Report dated Oct. 7, 2020, in connection with corresponding EP Application No. 20168144.2 (15 pp., including machine-generated English translation).

* cited by examiner

METHOD FOR PRODUCING A SEMICONDUCTOR MODULE BY USING ADHESIVE ATTACHMENT PRIOR TO SINTERING

FIELD

The disclosure relates to a method for producing a semiconductor module. In addition, the disclosure relates to a semiconductor module, a rectifier and/or inverter, and a motor vehicle.

BACKGROUND

Three-phase rectifiers or inverters formed by semiconductor switches can be used to drive a three-phase electric machine by means of alternating current or to provide direct current with the aid of a three-phase generator. For example, a respective half-bridge, i.e., a pair of semiconductor switches for each phase, can be arranged in a common housing and these housings can be arranged for example on a common heat dissipating body or contacted through a common circuit board. In the course of the manufacture of the semiconductor module, the individual components of the semiconductor module can be joined together by soldering or sintering, for example, and then be encased for example by injection molding, also known as Resin Transfer Molding. The substrate which carries the semiconductor component and contact elements for contacting the semiconductor module can be arranged on a carrier plate.

If many such semiconductor modules are combined into one structural unit, such as a rectifier or inverter, the relative orientation of the semiconductor modules to each other can be defined by the relative orientation of their carrier plates. A wrong positioning or orientation of the substrate relative to the carrier plate can therefore result in the relative positions of the contacts of the individual semiconductor modules with respect to each other differing from a nominal distribution. For example, if the individual semiconductor modules are contacted by means of a press fit, it is essential for there to be slight discrepancies, such as no more than 0.2 mm A correct positioning of the contacts arranged on the semiconductor module with respect to the carrier plate may also be essential to avoiding leakage during the encasing of the semiconductor module.

In order to connect the substrate to the carrier plate, a bonding layer is typically melted on, in order to solder or sinter the substrate to the carrier plate and join the substrate by sintering to the carrier plate. This can be done, for example, by heating the carrier plate and the substrate together in an oven while the substrate is held in the correct position with respect to the carrier plate. The positioning is usually done in this case by frames or other holders. The use of fastening frames is described for example in the document CN 103894697 A. Various sources of error may occur in this case. The frames used typically engage with the outside of the ceramic substrate, so that wrong dimensioning of the ceramic substrate, which might be as much as 0.2 mm for example, also results in position errors of the other components. Since, furthermore, such frames or fastening means, as well as the carrier plate, need to be oriented with respect to a third object, additional deviations may occur in this way. In order to avoid a damaging of the substrate, gaps of 0.1 mm for example are also typically required between the substrate and the frame, which can result in additional deviations. Hence, the mentioned almost inevitable deviations already mean that the permissible tolerance range for the positioning of the contacts relative to the base plate or other contacts of other modules is largely used up, so that either the manufacturing process for components consisting of multiple semiconductor modules needs to be modified in order to allow for larger tolerances, or one must expect relatively large reject rates.

SUMMARY

Hence, the problem which the invention proposes to solve is to indicate a method for the production of a semiconductor module which enables a positioning and orientation of the substrate relative to the carrier plate with high precision.

The problem is solved according to the invention by a method for producing a semiconductor module, involving the following steps:
  providing a carrier plate and a substrate having a bonding layer arranged on a surface of the carrier plate or the substrate,
  applying adhesive in multiple adhesive areas of the carrier plate or the substrate which are free from the bonding layer,
  positioning the substrate on the carrier plate such that the substrate and the carrier plate are in contact with the bonding layer and the adhesive, and
  joining the substrate and the carrier plate across the bonding layer by melting or sintering of the bonding layer.

It is thus proposed to utilize adhesive arranged on the carrier plate and on the substrate in order to hold the substrate in the correct position relative to the carrier plate. In this way, no additional components such as frames or the like are needed for the holding. The adhesive can first be applied to the component comprising the bonding layer. Alternatively, however, it would also be possible to apply the bonding layer to the carrier plate and the adhesive to the substrate, for example, or vice versa. If the adhesive is applied to the component without the bonding layer, the adhesive areas can be chosen such that the adhesive after the positioning of the substrate makes contact with the component having the bonding layer in areas which are free of the bonding layer.

The carrier plate with the substrate glued to it may then be transferred with no problem to an oven or the like in order to melt or sinter the bonding layer for a soldering. In this way, the accuracy of the positioning of the substrate relative to the carrier plate can be increased. This also results in a more accurate positioning and orientation of contacts relative to the base plate, so that on the one hand leakage can be prevented during the encasing and on the other hand multiple semiconductor modules can be coupled with no problem and with high accuracy to a common control board, for example. It is also possible for the substrate to be substantially congruent with a connection layer being sintered, thus preventing a portion of the sintered connection layer from being exposed and therefore sintered with less pressure, which might result in loose particles of the sintering compound, such as silver or copper.

The applying of the bonding layer to the carrier plate may be done in a prior step before the commencement of the method according to the invention, yet it may also be carried out as a separate step during the method according to the invention. For example, the bonding layer may consist of a solder or a soldering paste, in order to achieve a soldered connection between the bonding layer and substrate by melting of the bonding layer. Alternatively, the bonding layer may produce the connection by a sintering, for which a copper or silver sinter paste can be used, for example.

The surface of the adhesive areas can be smaller than the surface of the substrate or the bonding layer by at least a factor of 20 or at least a factor of 100 or at least a factor of 500. Preferably, moreover, the adhesive areas are provided in the marginal area of the substrate or the bonding layer. Thus, the adhesive areas may be relatively far removed from the semiconductor chips mounted on the substrate, so that the heat dissipation of these semiconductor chips through the carrier plate is substantially unaffected by using the adhesive. As shall be further explained later on, the adhesive can furthermore be entirely or at least for the most part evaporated during the course of the production of the semiconductor module, so that it ultimately does not influence the operating behavior of the semiconductor module in the finished module.

The dimensions of the bonding layer may correspond substantially to the dimensions of the substrate. In particular, the sum of the surface of the adhesive areas and the surface of the bonding layer may be equal to or slightly smaller than the surface of the substrate. In this way, as explained above, it is possible to prevent portions of the bonding layer from being exposed after the applying of the substrate, which might result in free particles for a sintered connection on account of deficient pressure during the sintering or a leakage of solder from the relevant area when using a soldered connection.

After applying the substrate on the carrier plate and the applying of semiconductor components or semiconductor chips and contacts on the substrate, the resulting semiconductor module can be encased, for example, by injection molding. Many such semiconductor modules can then be used, for example, to construct a rectifier or inverter. As the adhesive, one can use a hot-melt adhesive. For example, the adhesive can be chosen such that it has a melting temperature between 60° C. and 140° C., such as 100° C. It is possible for the adhesive to have an evaporation temperature between 160° C. and 300° C., especially more than 200° C.

The positioning of the substrate on the carrier plate can be done at a temperature at which the adhesive is liquid. For example, the adhesive may be solid at room temperature, so that the substrate is not movable relative to the carrier plate due to a cooldown of the adhesive after the positioning of the substrate, for example during a transfer of the carrier plate with the substrate arranged thereon to a further processing step. For example, during the positioning of the substrate, the carrier plate can be heated enough to liquefy the adhesive. If an adhesive with relatively low melting temperature is used, as mentioned above, this can be done without any problems within pick and place machines or other devices suitable for the positioning of the substrate.

Temperatures can be used for the melting or sintering of the bonding layer that are above the boiling temperature of the adhesive. This means that the adhesive evaporates at least partly during the melting or sintering. The adhesive may thus be removed entirely or at least partially without residue, thereby preventing it from affecting the further operating behavior of the semiconductor module. Even if the adhesive is largely or entirely evaporated in the course of the melting or sintering, it is typically still noticeable in the resulting produce, i.e., the produced semiconductor module, that an adhesive was used for the temporary fixation of the substrate on the carrier plate. In the method according to the invention, the adhesive is situated in the adhesive areas of the carrier plate which are free of the bonding layer. When using a sinter material as the bonding layer, these areas also remain free during the sintering, so that it is also recognizable in the produced semiconductor module that these areas were kept free in order to utilize adhesive in the course of the manufacturing. If the bonding layer consists of a solder, while this will run upon melting, nevertheless less wetting will typically occur in those areas that were initially free and where adhesive was situated. Thus, also in the resulting semiconductor module it is possible to recognize adhesive areas by their less wetting with solder.

A pick and place machine can be used for positioning in the method according to the invention for positioning the substrate on the carrier plate. The positioning can be done by a pick and place process, which is also known in particular from the field of SMD techniques. In this way, a highly accurate positioning and orientation can be achieved and in particular a better accuracy of the position and orientation than in the case of a frame-based positioning of the substrate on the carrier plate.

The adhesive can be situated in marginal recesses of the bonding layer. In other words, it is possible for the bonding layer not to enclose the adhesive areas in the plane of the bonding layer on all sides. This makes it possible for the adhesive to emerge from the area between substrate and carrier plate, especially after an evaporation.

The adhesive areas may be situated in recesses of a rectangular bonding layer, being situated at the edge and/or at least one corner of the bonding layer. In general, the adhesive area may have at least one free side where no adjacent bonding layer is arranged.

The adhesive used can be a plastic with a melting temperature between 60° C. and 140° C. and an evaporation temperature between 160° C. and 300° C.

A half-bridge can be produced as the semiconductor module or multiple semiconductor modules are produced, each of them being half-bridges and being used as a component of a semiconductor device, being a rectifier or an inverter. In other words, the method according to the invention may also be part of a method for production of a rectifier or inverter. Rectifiers and inverters based on semiconductor switches may have the same technical construction and differ only in regard to a control process and thus their power transfer direction. The semiconductor component produced may thus be used as a rectifier or an inverter, as needed. The designing of half-bridges and the construction of rectifiers or inverters from such half-bridges are known in the prior art and will not be discussed in detail. As already mentioned at the outset, however, it is especially relevant that the contacts of the different semiconductor modules can be oriented with high precision relative to each other in order to achieve a simple contacting or common heat dissipation of the modules.

Besides the method according to the invention, the invention relates to a semiconductor module, comprising a substrate carrying a semiconductor component, which is joined by a bonding layer to a carrier plate, wherein the semiconductor module is produced such that the substrate is at first held by an adhesive on the carrier plate before the joining of the substrate and the carrier plate across the bonding layer. It is possible for residues of the adhesive to remain in the semiconductor module, which can demonstrate a proper production of the semiconductor module. As already explained for the method according to the invention, however, it is also possible for the adhesive to be evaporated in the course of the production and thus be removed entirely or at least for the most part from the finished semiconductor module. As explained above, the use of the adhesive can still be recognized thanks to the distribution of the bonding layer or the wetting of the carrier plate by the bonding layer.

In particular, it is thus possible for the bonding layer to have marginal recesses or areas of less wetting in the semiconductor module according to the invention. These are the areas originally forming recesses in which the adhesive areas were situated.

The invention furthermore relates to a rectifier and/or inverter, which comprises three semiconductor modules according to the invention, each of which forms a half-bridge. As already explained above, the exactness of the positioning and orientation of the substrate relative to the carrier plate which can be achieved by the adhesive is especially relevant to this application.

Moreover, the invention furthermore relates to a motor vehicle, comprising at least one semiconductor module according to the invention and/or at least one rectifier and/or inverter according to the invention. The rectifier and/or inverter may serve in particular for providing alternating voltage, especially three-phase alternating voltage, to an electric machine of the motor vehicle, especially a drive motor. Alternatively or additionally, it may serve for providing a direct current during a generator operation of the electric machine, for example in order to energize a vehicle network or charge a battery of the motor vehicle.

BRIEF DESCRIPTION OF THE DRAWINGS

Further advantages and details of the invention will emerge from the following exemplary embodiments as well as the accompanying drawings. There are shown, schematically.

DETAILED DESCRIPTION

Figure 1:
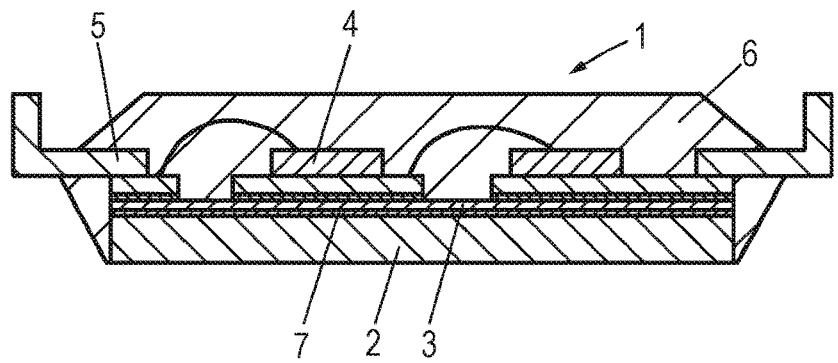
FIG. 1 an exemplary embodiment of a semiconductor module according to the invention, FIG. 2 various steps in an exemplary embodiment of the method according to the invention for the production of a semiconductor module, FIG. 3 various steps in an exemplary embodiment of the method according to the invention for the production of a semiconductor module, FIG. 4 an alternative arrangement of the adhesive areas in a further exemplary embodiment of the method according to the invention, and FIG. 5 an exemplary embodiment of a motor vehicle according to the invention, comprising an exemplary embodiment of a rectifier and inverter according to the invention.

FIG. 1 shows an exemplary embodiment of a semiconductor module 1, comprising a substrate 3, which carries the semiconductor components 4, such as semiconductor chips, and contact elements 5. The substrate 3 is connected by a bonding layer 7 to a carrier plate 2, for example by sintering or soldering. The mentioned components can then be encased by a casting compound 6, such as by injection molding.

The semiconductor module 1 may be in particular a half-bridge, while three of these half-bridges can be assembled to form a rectifier or inverter for three-phase alternating voltages, as will be explained more closely later on. It may be desirable, for example, to arrange the three semiconductor modules 1 on a common heat dissipating body and to connect their contact elements 5 across a common circuit board, for example by a press fit. It is thus highly relevant for the positions and orientations of the contact elements 5 relative to the carrier plate 2 to be dictated with high precision.

One limiting factor here may be the precision with which the substrate 3 is arranged on the carrier plate 2. In order to achieve a high precision, the semiconductor module 1 is fabricated such that the substrate 3 is held at first by an adhesive on the carrier plate 2 before the connecting of the substrate 3 and the carrier plate 2 by the bonding layer 7. It is possible for the adhesive to be largely or even entirely evaporated in the course of the fabrication, so that no adhesive remains in the finished semiconductor module 1. However, the use of the adhesive in the manufacturing process can be recognized by the form of the sinter layer 7 when using a sintered bonding layer 7, or by the fact that areas of the carrier plate 2 where the adhesive was arranged are less well wetted, when using a connection layer 7 made of solder.

The method for the production of the semiconductor module 1 shall be explained more closely in the following with regard to FIGS. 2 and 3. First of all, a carrier plate 2 is provided with a bonding layer 7 arranged on the surface 8 of the carrier plate 2. The bonding layer 7 can be applied in the course of the method or in a preparatory step. In order to allow a precise positioning and orientation of the carrier plate 2 with respect to the tooling used, multiple marginal openings 12 are provided on it. The bonding layer 7 for example may consist of a solder paste or a copper or silver sinter paste.

As explained above, the substrate 3 should first be held by adhesive 9 on the carrier plate. Therefore, the bonding layer 7 comprises marginal recesses 11 on its edges 16, in which the surface 8 of the carrier plate 2 is exposed. Adhesive, preferably a hot-melt adhesive, is at first applied in adhesive areas 10 within these recesses 11. Preferably, the corresponding glue spots are applied by machine. An adhesive 9 is used which is solid at room temperature. It is therefore possible for the adhesive 9 to be cured at first on the carrier plate 2, before a further processing ensues.

In one alternative not represented, it would also be possible to arrange the bonding layer 7 and/or the adhesive 9 on the substrate 3 instead of the carrier plate 2.

Figure 3:
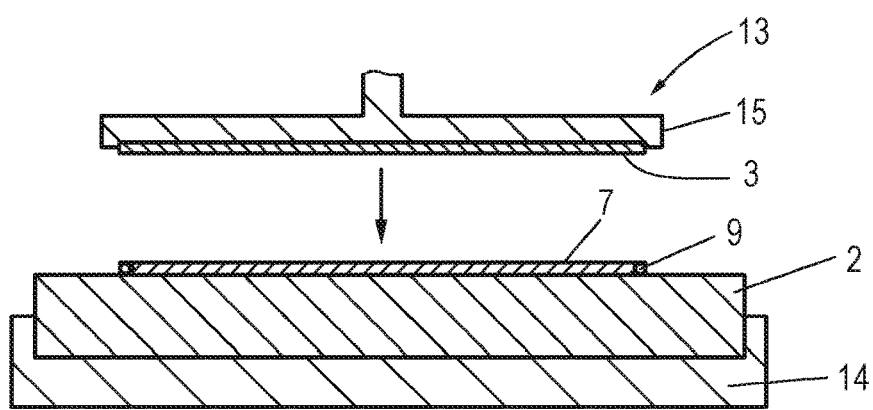

In a following step, as shown in FIG. 3, the substrate 3 is arranged on the carrier plate 2 such that the substrate 3 and the carrier plate 2 are both in contact with the bonding layer 7 and the adhesive 9. The positioning of the substrate 3 on the carrier plate 2 is done at a temperature at which the adhesive is liquid, such as 100° C. A pick and place machine 13 can be used for the positioning of the substrate 3, of which only one holder 14 for the carrier plate 2 and an assembly element 15 holding the substrate 3 are shown in FIG. 3. Such pick and place machines are known, for example from the field of SMD assembly and they can be used to place components with high precision.

After the positioning of the substrate 3 on the carrier plate 2, the temperature can be reduced, so that the adhesive 9 hardens and the carrier plate 2 is held with high precision at a defined position and with a defined orientation relative to the carrier plate 2.

The carrier plate 2 with the substrate 3 glued onto it can then be transferred to an oven or another heating appliance. There, the temperature can be increased, especially by exerting a pressure on the substrate 3, in order to join the substrate 3 and the carrier plate 2 by sintering of the bonding layer 7 or to melt the bonding layer 7 in order to solder the substrate 3 to the carrier plate. Temperatures are preferably used which lie above the boiling temperature of the adhesive 9. The adhesive 9 may thus evaporate in the course of the sintering or melting and, since it is arranged at the margin with respect to the bonding layer 7, escape from the gap between the carrier plate 2 and the substrate 3. In this way, it is possible for the adhesive 9 to be removed at least for the most part with no residue. However, since the form of the bonding layer 7 parallel to the surface 8 of the carrier plate 2 is substantially unchanged during the sintering, it can still be clearly recognized after a sintering that the bonding layer 7 has the recesses 11, indicating a use of adhesive 9 for the fabrication. Also when using a solder as the bonding layer 7, which is melted, it is typically clearly recognizable that the carrier plate 2 has worse wetting in the region of the recesses 11 or in the adhesive areas 10 than in the other regions. This also points to a use of adhesive during the fabrication of the semiconductor module 1.

Figure 2:
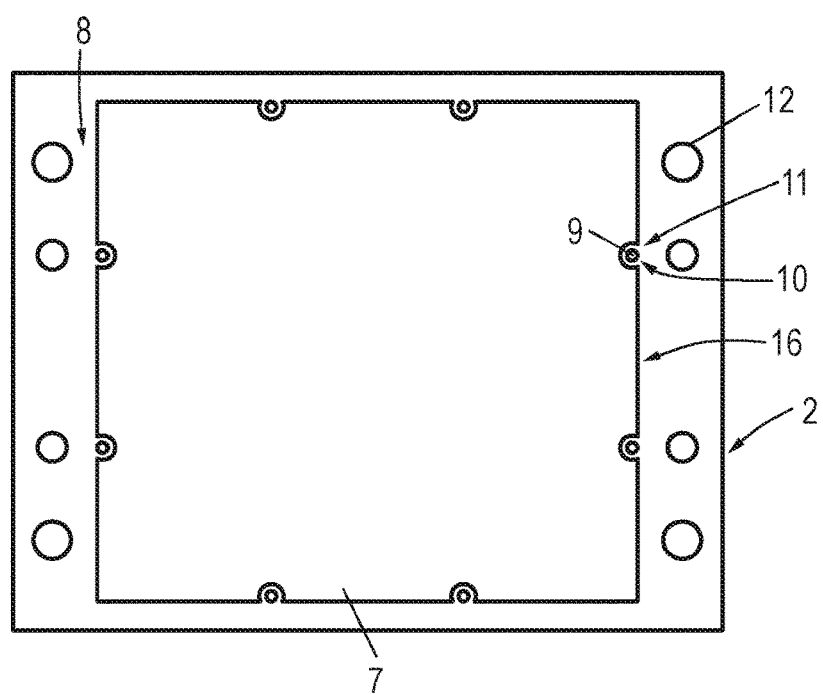
Figure 4:
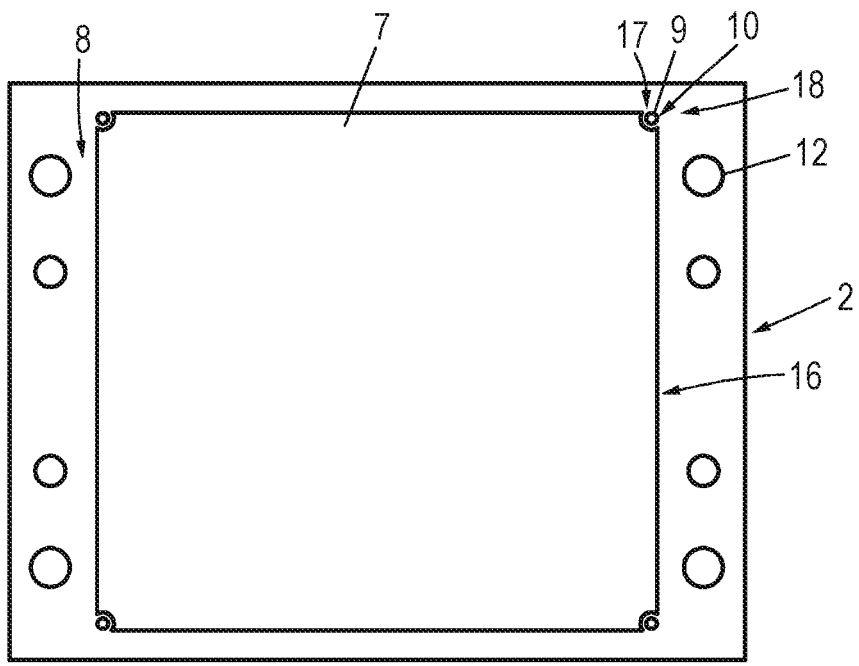

The arrangement of the adhesive areas 10 in recesses 11 of the margins 16 as shown in FIG. 2 is merely exemplary. Of course, it is possible to use more or fewer adhesive areas, differing from the symmetrical distribution shown in FIG. 2. A marginal arrangement of adhesive areas 10 especially also in recesses 17 at corners 18 of the bonding layer 7 is also possible, as shown in FIG. 4. An arrangement of the adhesive 9 at corners 18 may be used in addition or alternatively to the arrangement shown in FIG. 2.

Figure 5:
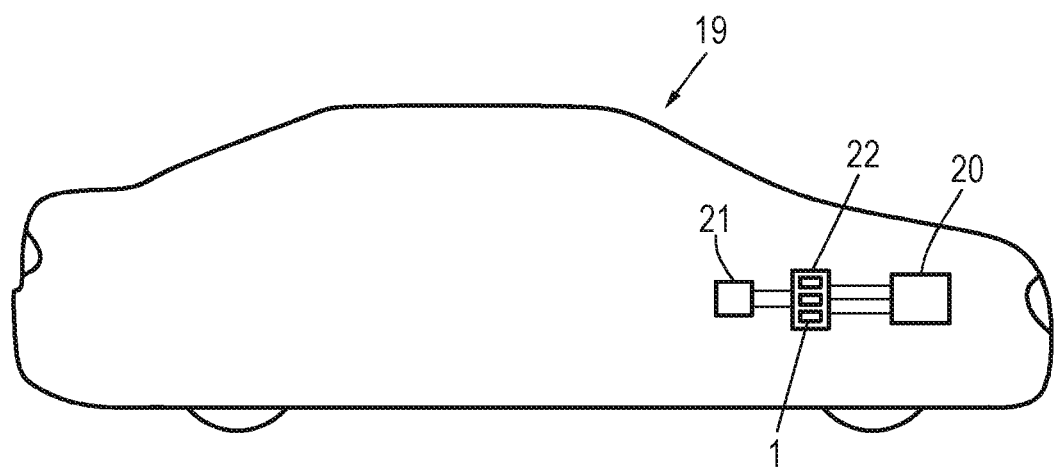

FIG. 5 shows the use of a correspondingly manufactured semiconductor module 1 in a motor vehicle 19. Here, one half-bridge is implemented respectively by the semiconductor module 1 and three of these half-bridges are assembled to form a rectifier and inverter 22. The construction of a rectifier and inverter from multiple half-bridge modules is basically known in the prior art and shall not be explained in detail. What is relevant here is that it should preferably be possible to arrange several of the semiconductor modules 1 on a common heat dissipating body or to have them contact a common circuit board. It is therefore required for the contact elements 5 of the different semiconductor modules 1 to have a defined relative arrangement to each other. This, in turn, requires that the contact elements 5 and thus also the substrate 3 be arranged with high precision relative to the carrier plate 2, which can be accomplished by the above described method.

The motor vehicle 19 comprises an electric machine 22, especially a drive machine of the motor vehicle 19, which is supplied through a battery 21 or another direct current source, such as a vehicle network. In order to transform the dc voltage of the battery 21 or the vehicle network into a three-phase alternating voltage, the rectifier and inverter 22 is used. This may furthermore be used during a generator operation of the electric machine 20 to provide direct current for the battery 21 or the vehicle network.

The invention claimed is:

1. A method for producing a semiconductor module, comprising the steps:
   providing a carrier plate and a substrate having a bonding layer arranged on a surface of the carrier plate or the substrate,
   applying adhesive in multiple adhesive areas of the carrier plate or the substrate which are free from the bonding layer, wherein a temperature of the adhesive is kept above a melting temperature between 60° C. and 140° C.,
   positioning the substrate on the carrier plate such that the substrate and the carrier plate are in contact with the bonding layer and the adhesive, wherein positioning of the substrate on the carrier plate is done while the adhesive is at the temperature above the melting temperature, and
   joining the substrate and the carrier plate across the bonding layer by melting or sintering of the bonding layer.

2. The method according to claim 1, wherein temperatures are used for the melting or sintering of the bonding layer that are above the boiling temperature of the adhesive.

3. The method according to claim 1, wherein a pick and place machine is used for positioning the substrate on the carrier plate.

4. The method according to claim 1, wherein the adhesive is situated in marginal recesses of the bonding layer.

5. The method according to claim 1, wherein the adhesive used is a plastic with a melting temperature between 60° C. and 140° C. and an evaporation temperature between 160° C. and 300° C.

6. The method according to claim 1, wherein a half-bridge is produced as the semiconductor module or multiple semiconductor modules are produced, each of them being half-bridges and being used as a component of a semiconductor device, being a rectifier or an inverter.

7. The method according to claim 2, wherein a pick and place machine is used for positioning the substrate on the carrier plate.

8. The method according to claim 2, wherein the adhesive is situated in marginal recesses of the bonding layer.

9. The method according to claim 3, wherein the adhesive is situated in marginal recesses of the bonding layer.

10. The method according to claim 2, wherein the adhesive used is a plastic with a melting temperature between 60° C. and 140° C. and an evaporation temperature between 160° C. and 300° C.

11. The method according to claim 3, wherein the adhesive used is a plastic with a melting temperature between 60° C. and 140° C. and an evaporation temperature between 160° C. and 300° C.

* * * * *